United States Patent [19]
Colby et al.

[11] Patent Number: 5,883,344
[45] Date of Patent: Mar. 16, 1999

[54] AUTOMATIC CALIBRATION OF FIELD-ORIENTED ELEVATOR MOTOR DRIVE PARAMETERS USING STANDSTILL MOTOR MEASUREMENTS

[75] Inventors: Roy Stephen Colby, Raleigh, N.C.; Alberto Vecchiotti, Middletown; Leslie M. Lamontagne, Prospect, both of Conn.

[73] Assignee: Otis Elevator Company, Farmington, Conn.

[21] Appl. No.: 996,265

[22] Filed: Dec. 22, 1997

[51] Int. Cl.$^6$ .............................. B66B 1/28; H02P 5/28; G05B 13/02

[52] U.S. Cl. ....................... 187/393; 318/607; 64/148; 181/296

[58] Field of Search ................................. 187/393, 296, 187/391; 364/148, 150, 152, 161; 318/609, 610, 798, 799

[56] References Cited

U.S. PATENT DOCUMENTS

| | | | |
|---|---|---|---|
| 5,476,158 | 12/1995 | Mann et al. | 187/289 |
| 5,689,169 | 11/1997 | Kerkman et al. | 318/807 |

OTHER PUBLICATIONS

M. Depenbrock and N.R. Klaes, *Determination of the Induction Machine Parameters and their Dependencies on Saturation*, Ruhr–University Bochum, Germany, pp. 17–22.

N.R. Klaes, *Parameter Identification of an Induction Machine with Regard to Dependencies on Saturation*, IEEE Transactions on Industry Application, vol. 29, No. 6, Nov. 1993.

A. M. Khambadkone and J. Holtz, *Vector–Controlled Induction Motor Drive with a Self–Commissioning Scheme*, IEEE Transactions on Industrial Electronics, vol. 38, No. 5, Oct. 1991.

J. Holtz and T. Thimm, *Identification of the Machine Parameters in a Vector–Controlled Induction Motor Drive*, IEEE Transactions on Industry Applications, vol. 27, No. 6 Nov./Dec. 1991.

T. Rowan, R. Kerkman and D. Leggate, *A Simple On–Line Adaption for Indirect Field Orientation of an Induction Machine*, IEEE Transactions on Industry Applications, vol. 27, No. 4 Jul./Aug. 1991.

R. Kerkman, J. Thunes, T. Rowan and D. Schlegel, *A Frequency–Based Determination of Transient Inductance and Rotor Resistance for Field Commissioning Purposes*, IEEE Transactions on Industry Applications, vol. 32, No. 3, May/Jun. 1996.

H. Schierling, *Self–Commissioning—A Novel Feature of Modern Inverter–Fed Induction Motor Drives*, pp. 287–290.

M. Summer and G. Asher, *Autocommissioning for voltage–referenced voltage–fed vector–controlled induction motor drives*, IEEE Proceedings, vol. 140, No. 3, May 1993.

Kudor et al, *Self–Commissioning for Vector Controller Inductor Motors*, IEEE 1993, pp. 528–535.

Tungpimolrut et al, *A Direct Measuring Method of Machine Parameters for Vector–Controlled Induction Motor Drives*, 1993 IEEE pp. 997–1002.

(List continued on next page.)

*Primary Examiner*—Robert E. Nappi

[57] ABSTRACT

An elevator controller 7 is provided with logic 48 which automatically calculates a motor time constant ($\tau_R$), a torque constant ($K_T^*$), and a magnetizing current (Id) for a field-oriented motor/drive system by calculating a transient inductance Lσ, injecting a variable input frequency sinewave into a q-axis reference current $I_{qREF}$ and varying the input frequency while calculating an imaginary part of a rotor impedance Imag($Z_R$) to obtain a frequency ($F_{PEAK}$) at which the maximum value of Imag($Z_R$) occurs, then calculating $\tau_R$ from $F_{PEAK}$. $K_T^*$, Id, and a total motor voltage $V_M$ are calculated and Id is varied until a ratio of rated motor voltage (Vph_RATED) to $V_M$ is within a predetermined tolerance of one. The procedure is performed with the rotor locked.

10 Claims, 5 Drawing Sheets

OTHER PUBLICATIONS

Green et al, Measurement and On–line Estimation Approaches to a Parameter Variation in Vector Controllers, IEEE Colloq. 1993. pp. 3/1–3/5.

Wade et al, Parameter Identification for Vector Controlled Induction Machines, Heriot–Wat University, UK, pp. 1187–1192.

Bunte et al, Parameter Identification of an Inverter–fed Induction Motor at Standstill with Correlation Method, University Paderborn—Germany, The European Power Electronics Association 1993, pp. 97–102.

Wang et al, An Automated rotor time Constant Measurement System for Indirect Field–Oreinted Drives, IEEE Transaction on Industry Applications, vol. 24, No. 1, Jan./Feb. 1988.

Lorenz, Tuning of Field–Oriented Induction Motor Controllers for High–Performance Applications, IEEE Transactions on Industry Applications, vol. 1A–22, No. 2, Mar./Apr. 1986.

D. W. Novotny and T.A. Lipo, Vector Control and Dymanics of AC Drives, Oxform Science Publications, pp. 205–251.

DeDoncker et al, The Unversity Field Oriented Controller, Unversity of Wisconsin.

Lorenz et al, A control systems Perspective of field oriented Control for AC Servo Drives, University of Wisconsin.

Novotny and Lipo, WEMPEC, Wisconsin Electric Machines and Power Electronics Consortium, Tutorial Report, Chapter 4–1—4–73.

AUTOMATIC CALIBRATION OF FIELD-ORIENTED ELEVATOR MOTOR DRIVE PARAMETERS USING STANDSTILL MOTOR MEASUREMENTS

CROSS REFERENCES TO RELATED APPLICATIONS

Co-pending U.S. patent applications, Ser. Nos. 08/996,234, 08/996,263, 08/996,262, 08/996,266, 08/996,264, filed contemporaneously herewith, contain subject matter related to that disclosed herein.

TECHNICAL FIELD

This invention relates to calibrating a field-oriented motor drive and more particularly to automatic calibration of field-oriented (or vector-controlled) drive parameters for an elevator motor drive.

BACKGROUND OF THE INVENTION

It is known in the art of field-oriented (or vector-controlled) motor drives and motor speed controls that such drives and controls require knowledge of the motor parameters such as the rotor time constant ($\tau_R$), torque constant ($K_T^*$), and rated magnetizing current $I_{dRATED}$.

One technique used to determine these motor parameters is to analyze the motor in an engineering laboratory using a dynamometer and expensive test equipment and performing time consuming, highly technical tasks by a skilled technician or engineer. However, in modernization or retrofit applications, where a new drive replaces an older drive in an existing elevator system, it is not convenient or cost effective to remove the motor from the elevator system for evaluation of the motor.

Also, it is desirable to determine the motor parameters based on measurements made on the motor at standstill. While techniques exist to determine the motor parameters while the motor is running (at no-load and under-load), it is not always practical to run such tests in an elevator application. In particular, a no-load test is not practical because this would require unroping the elevator or disconnecting the motor from the gearbox. Further, performing a test under load, i.e., with the motor connected to an elevator, is not practical because it is necessary to have approximately correct motor parameters to start the elevator moving to obtain measurements of the motor running under-load. Also, it is desirable that the technique for determining such motor parameters be wholly contained within the drive control itself, so that field commissioning of retrofit or modernization drives may be performed by installers and service personnel without requiring specific motor/drive tuning skills.

DISCLOSURE OF THE INVENTION

Objects of the invention include provision of automatic, on-site, calibration of motor parameters for field-oriented drives and/or controls for elevators, which does not require removal or uncoupling of the motor from the elevator system, and which uses only standstill measurements of the motor.

According to the present invention, a method for calculating at least one parameter of an elevator motor operated by field-oriented control, using standstill measurements of the motor, the motor having a motor impedance $Z_M$, a rotor impedance $Z_R$, and a transient inductance $L\sigma$, includes: a) providing a sinusoidal torque current reference signal at a high frequency ($F_{HIGH}$) high enough such that the motor impedance ($Z_M$) is dominated by the transient inductance ($L\sigma$); b) measuring a feedback torque current (Iq) and a feedback torque voltage (Vq); c) calculating the transient inductance ($L\sigma$) at the high frequency ($F_{HIGH}$), by the equation: $L\sigma = \text{Imag}(Z_M)@F_{HIGH}/(2\pi F_{HIGH})$, where $Z_M = Vq/Iq$; d) providing a sinusoidal torque current reference signal having a variable input frequency; e) measuring the feedback torque current (Iq) and the feedback torque voltage (Vq); f) calculating an imaginary part of the rotor impedance $\text{Imag}(Z_R)$ as follows: $\text{Imag}(Z_R) = \text{Imag}(Z_M) - \omega L\sigma$, where $\omega$ is the input frequency, and $Z_M = Vq/Iq$; g) varying the input frequency and performing steps (d)–(f) to obtain the frequency ($F_{PEAK}$) at which the maximum value of $\text{Imag}(Z_R)$ occurs; and h) calculating a rotor time constant ($\tau_R$) based on $F_{PEAK}$.

According further to the present invention, $\tau_R$ is calculated as follows: $\tau_R = 1/(2\pi F_{PEAK})$. According still further to the present invention, an additional step of calculating a magnetizing inductance $L\phi$ is performed as follows: $L\phi = 2\text{Imag}(Z_R)/\omega @ \omega = 1/\tau_R$.

According still further to the present invention, the following additional steps are performed: i) calculating a motor torque constant ($K_T^*$) using the equation: $K_T^* = (3/2)(P/2)L\phi Id^*$, where: P=number of motor poles, $Id^* = Vph\_RATED/(\omega R\_RATED \times L\phi)$, and $Vph\_RATED$ = rated motor voltage, $\omega R\_RATED$ = rated motor speed; j) calculating a motor voltage ($Vm^*$) using the equation: $Vm^* = (Vd^{*2} + Vq^{*2})^{1/2}$, where: $Vd^* = \omega_E L\sigma Iq^*$, $Vq^* = \omega_E Ls Id^*$, $Iq^* = T\_RATED/K_T^*$, $T\_RATED$ is the rated motor torque, $\omega_E^* = \omega_{R\_RATED} + \omega_S^*$, and $\omega_S^* = (1/\tau_R)(Iq^*/Id^*)$; k) calculating a ratio of $Vph\_RATED$ to $Vm^*$; and l) varying $Id^*$ and performing steps (h)–(k) until the ratio is within a predetermined tolerance of 1.

The present invention represents a significant improvement over the prior art by providing automatic calibration of a field-oriented (or vector-controlled) induction motor controller for an elevator system based on standstill measurements of the induction motor. The invention provides motor parameters such as the rotor time constant ($\tau_R$), torque constant ($K_T^*$), and rated magnetizing current $I_{dRATED}$, without disconnecting the motor from the elevator system or from the gearbox. The invention also computes transient inductance $L\sigma$, magnetizing inductance $L\phi$, stator resistance Rs, and rated torque current $I_{qRATED}$, as needed by a given application. Further, the invention does not require a specially trained engineer with special test equipment to tune the motor/drive system. Thus, the invention greatly reduces cost associated with tuning the motor drive when new motors drives are retrofit into job sites. Accordingly, automatic calibration of motor parameters at the field site saves both time and money. As a result, the present invention makes it more attractive for building owners to upgrade their elevator systems to modern controls, which are currently economically impractical due to the high cost of determining parameters of older motors found in modernization job sites.

The foregoing and other objects, features and advantages of the present invention will become more apparent in light of the following detailed description of the exemplary embodiments thereof, as illustrated in the accompanying drawings.

BEST MODE FOR CARRYING OUT THE INVENTION

Figure 1:
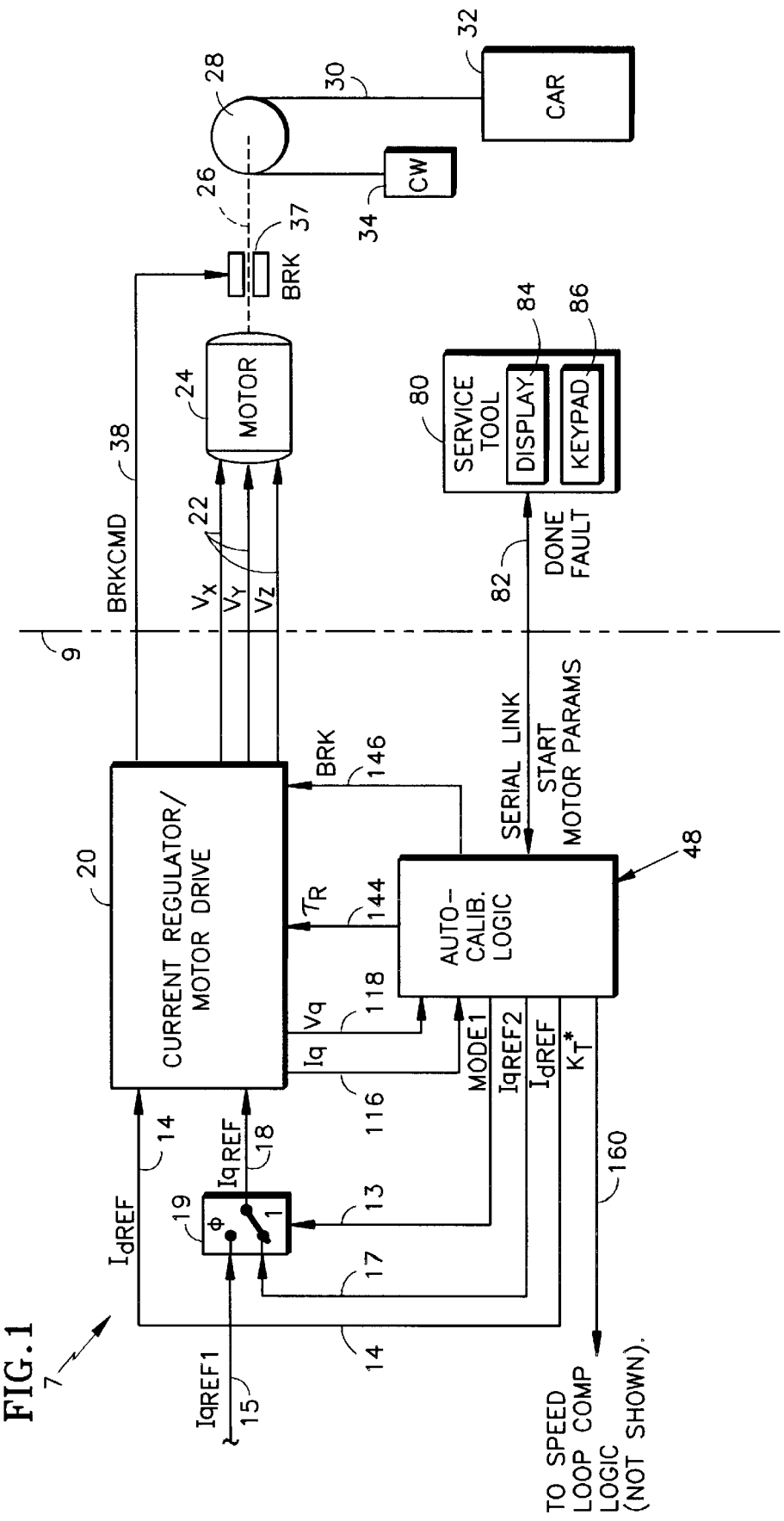
FIG. 1 is a schematic block diagram of a motor controller with auto-calibration logic, in accordance with the present invention.

Referring to FIG. 1, a portion of an elevator motor controller 7 shown to the left of the line 9, includes a field-oriented (or vector-based) motor control that has two control loops each corresponding to a different control axis, a d-axis relating to motor magnetization, and a q-axis relating to torque. The d-axis loop has a d-axis current reference input signal $I_{dREF}$ provided on a line 14. $I_{dREF}$ is set to a predetermined constant value so as to provide appropriate magnetic flux in the motor based on motor magnetization curves, e.g., $I_{dRATED}$ or $I_{NO\text{-}LOAD}$, discussed more hereinafter. The $I_{dREF}$ signal is fed to a field-oriented current regulator/motor drive circuit 20, described more hereinafter with FIG. 2.

The q-axis current loop has a first q-axis current reference input signal $I_{qREF1}$ on a line 15 is fed to one input of a switch 19. $I_{qREF1}$ is provided by other logic (not shown), such as speed loop compensation logic (not shown), which closes a motor speed control loop, such as that described in Copending U.S. patent application, Ser. No. (Otis Docket No. OT-3054), which provides the q-axis current reference signal to the controller when it is not in auto-calibration.

The other input to the switch 19 is a second q-axis current reference input signal $I_{qREF2}$ on a line 17. The output of the switch 19 is the q-axis current loop reference signal $I_{qREF}$ on a line 18, which is set equal to $I_{qREF1}$ or $I_{qREF2}$ based on the state of the MODE1 signal provided to the switch 19 on the line 13. The $I_{qREF}$ signal is fed to the field-oriented current regulator/motor drive circuit 20, described more hereinafter with FIG. 2.

Two examples of three phase AC induction motors used with the present invention are, Model LUGA-225LB-04A, by Loher, having a rated power of 45 KW, rated voltage of 355 volts, rated speed of 1480, and rated frequency of 50 Hz, in a geared configuration; and Model 156MST, by Tatung (of Taiwan), having a rated power of 40 KW, rated voltage of 500 volts, rated speed of 251, and rated frequency of 16.7 Hz, in a gearless configuration. Other motors having other rated parameters may be used if desired.

The circuit 20 provides three phase voltage signals Vx,Vy, Vz on lines 22 to a motor 24, e.g., a three phase induction motor. The motor 24 is connected by a mechanical linkage 26, e.g, a shaft and/or a gearbox, to a sheave 28. A rope or cable 30 is wrapped around the sheave 28 and has one end connected to an elevator car 32 and the other end connected to a counterweight 34. The weight of the counterweight is typically equal to the weight of an empty car plus 40–50% of the max load in the car.

Other elevator system configurations, and with or without a counterweight, with or without a gearbox, may be used if desired to convert the output torque of the motor 24 to movement of the elevator cab 32, such as dual lift (where two elevator cars are connected to a single rope, the cars move in opposite directions and each car provides a counterweight for the other car), drum machine (where the rope is wrapped around a drum driven by a motor), etc.

A brake 37, e.g., an electromagnetic actuated disk brake, is disposed on the shaft 26, and is driven by an electrical brake command signal BRKCMD on a line 38 from the circuit 20. The brake 37, when activated or "dropped", clamps onto the shaft 26 and prevents the motor shaft 26 from turning, i.e., locks the rotor, and thus prevents the sheave 28 from moving.

Figure 2:
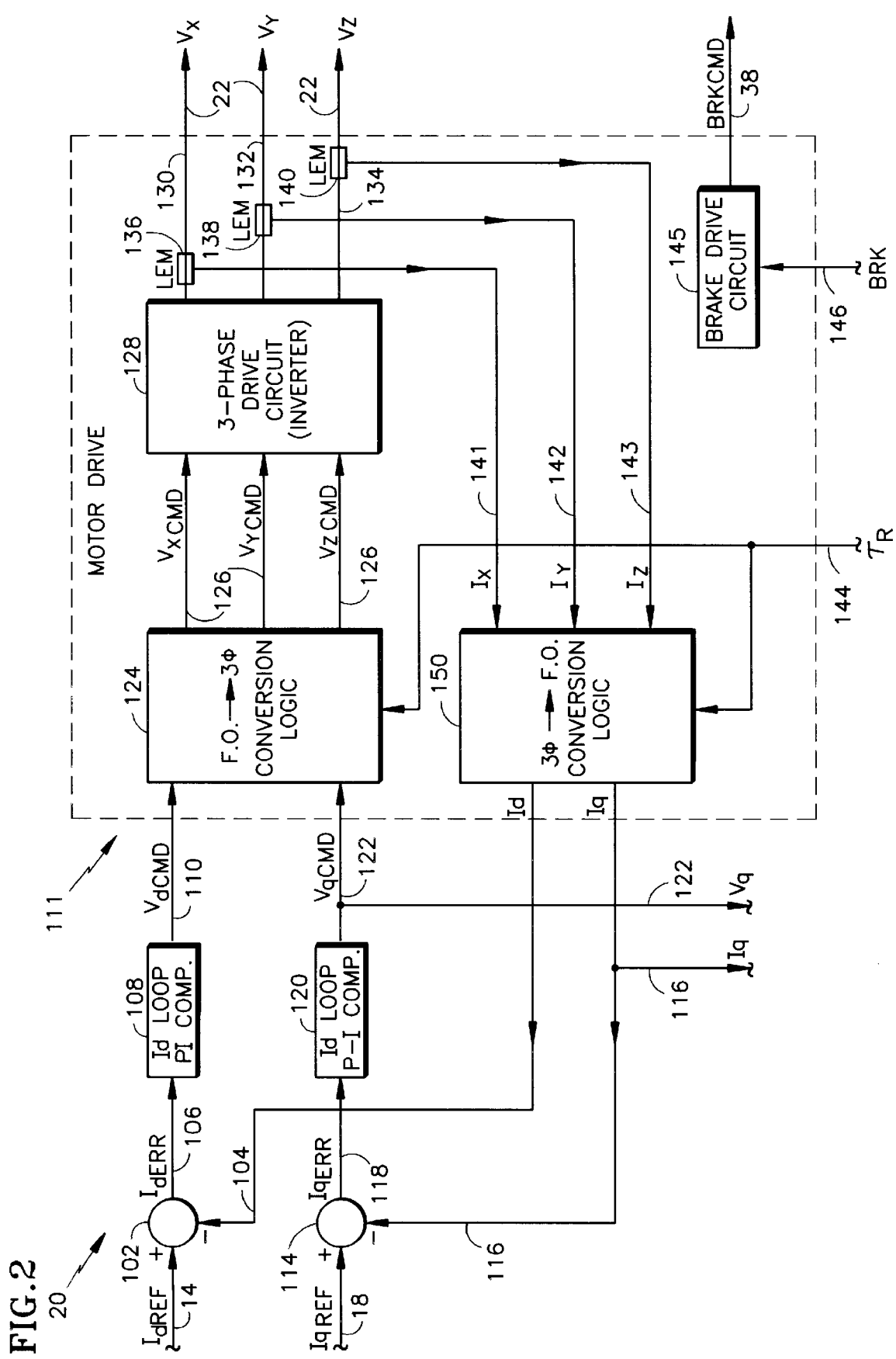
FIG. 2 is a schematic block diagram of a current regulator/motor drive, in accordance with the present invention.

Referring to FIG. 2, it is known in the art of field-oriented motor control that such control uses current (Id,Iq) and voltage (Vd,Vq) parameters corresponding to the d and q axes, respectively. Using field orientation, the motor magnetic field (or flux) will be controlled by Id and the motor torque will be controlled by Iq, as is known. In particular, the field-oriented current regulator/motor drive 20 of FIG. 1 comprises two current control loops, one for the d-axis current Id and one for q-axis current Iq. The Id loop receives the $I_{dREF}$ signal on the line 14 to a positive input to a summer 102. A measured or feedback d-axis current signal Id on a line 104 is fed to a negative input to the summer 102. The output of the summer 102 is an error signal $I_{dERR}$ on a line 106 which is fed to control compensation logic 108, such as proportional-plus-integral (P-I) current loop control. Other current loop control compensation may be used if desired. The logic 108 provides a d-axis voltage command signal $V_{dCMD}$ on a line 110.

For the q-axis, the Iq loop receives the $I_{qREF}$ signal on the line 18 to a positive input to a summer 114. A measured or feedback q-axis current signal Iq on a line 116 is fed to a negative input to the summer 114. The output of the summer 114 is an error signal $I_{qERR}$ on a line 118 which is fed to control compensation logic 120, e.g., proportional-plus-integral (P-I) logic similar to the logic 108. The output of the logic 120 is a q-axis voltage command signal $V_{qCMD}$ on a line 122. Other control compensation, e.g., proportional, lead-lag, etc., may be used for the logics 108,120. The form of compensation used is not critical to the present invention.

The voltage commands $V_{dCMD}$ and $V_{qCMD}$ are fed to known field-oriented to three-phase conversion logic 124 which converts the d-axis and q-axis voltage commands to three phase voltage commands $V_{XCMD}$, $V_{YCMD}$, $V_{ZCMD}$ on lines 126. The phase voltage commands $V_{XCMD}$, $V_{YCMD}$, $V_{ZCMD}$ are fed to a known three phase drive circuit (or inverter) 128 which provides three phase voltages $V_X,V_Y,V_Z$ on lines 130, 132, 134, respectively (collectively, the lines 22), to drive the motor 24.

Within the drive circuit 128 (details not shown), each of the voltage commands $V_{XCMD}$, $V_{YCMD}$, $V_{ZCMD}$ on lines 126 are converted to percent duty cycle commands indicative of the corresponding input voltage level. The percent duty cycle is converted into a pulse-width-modulated drive signal which drives power transistors to provide the pulse-width-modulated, variable frequency, three phase voltages $V_X,V_Y,$ $V_Z$ on lines 130, 132, 134, respectively. The conversions within the drive 128 are performed using electronic components and/or software well known in the art of motor drive circuits. Any other type of drive circuit that receives input voltage commands and provides output phase voltages may be used, and the phase voltages need not be pulse-width modulated.

Phase currents $I_X$, $I_Y$, $I_Z$ associated with the voltages $V_X, V_Y, V_Z$, respectively, are measured by known current sensors 136, 138, 140, e.g., closed-loop Hall-effect current sensors (such as LEMS), respectively, and are provided on lines 132, 134, 136, respectively. The phase currents $I_X$, $I_Y$, $I_Z$ are fed to known three phase to field oriented conversion logic 142, which provides a known conversion from phase currents to d-axis and q-axis currents on the lines 104, 116 which are fed to the summers 102, 114, respectively.

The converters 124, 150 provide known conversions between vector (d and q axis) parameters and per-phase parameters, such as that described in D. Novotny, et al, "Vector Control and Dynamics of AC Drives", Oxford University Press, 1996, Ch 5, pp 203–251. The converters 124, 15 may likely implement such conversions in software using a microprocessor or the like.

It is known in the art of field oriented drives that the value of the rotor time constant $\tau_R$ of the motor being controlled is required to perform the conversion to and from the field oriented d and q axes. In particular, $\tau_R$ is used to establish the correct slip frequency $\omega_S$ to achieve field orientation. The value of the rotor time constant $\tau_R$ is provided to the two converters 124, 150 on a line 144.

The motor drive logic 111 also includes a brake drive circuit 145 which receives an input signal BRK on a line 146 and provides a BRKCMD signal on the line 38.

Referring to FIG. 1, the present invention comprises auto-calibration logic 48 which automatically computes the motor parameters $\tau_R$, $K_T^*$, $I_{dRATED}$, and provides $\tau_R$ on the line 144 to the circuit 20, provides $I_{dRATED}$ as $I_{dREF}$ on the line 14 to the circuit 20, and provides $K_T^*$ on a line 160 to speed loop compensation logic (not shown) such as that described in Copending U.S. Patent Application (OT-3054), filed contemporaneously herewith. The logic 48 also computes other motor parameters such as transient inductance L$\sigma$, magnetizing inductance L$\phi$, stator resistance Rs (or R1) and rated torque current $I_{qRATED}$. The logic 48 receives Vq and Iq from the circuit 20. The logic 48 also provides the current reference signal $I_{qREF2}$ to the switch 19, and provides $I_{dREF}$ to the circuit 20 on the line 14.

The logic 48 comprises known electronic components, which may include a microprocessor, interface circuitry, memory, software, and/or firmware, capable of performing the functions described herein.

The logic 48 also provides the MODE1 signal on the line 13 to the switch 19. The MODE1 flag causes the current reference signal $I_{qREF2}$ from the calibration logic 48 to be fed to the logic 20. The logic 48 also provides a break request signal BRK on the line 146 to the circuit 20.

The calculation logic 48 also communicates with a service tool 80 over a serial link 82. The service tool 80 includes a display 84 and a keypad (or keyboard) 86 for entering data into the service tool 80 and over the link 82 to the controller 7. In particular, the logic 48 receives a start command over the link 82 from the service tool 80, which controls when auto-calibration is started. The logic 66 also provides a DONE signal and a FAULT signal to the service tool 80 over the link 82. The DONE signal indicates when auto-calibration has completed without faults and the FAULT signal indicates when a fault has been detected during auto-calibration.

Figure 3:
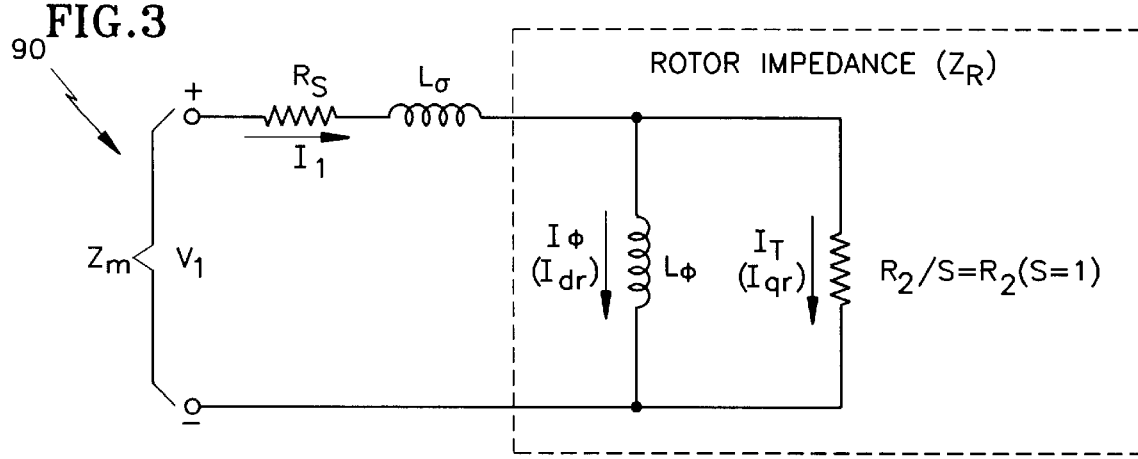
FIG. 3 is a schematic drawing of an equivalent circuit model of an induction motor controlled by field orientation, in accordance with the present invention.

Referring to FIG. 3, a known equivalent circuit 90 of an induction motor is similar to that described in "Vector Control and Dynamics of AC Drives", Novotny and Lipo, Oxford 1996, Chapter 5. FIG. 3 is a per-phase equivalent circuit for AC steady state operation where the current I1 and voltage V1 are phasor quantities. The circuit 90 comprises a resistor Rs in series with an equivalent "transient" inductor L$\sigma$ in series with a rotor impedance $Z_R$ which comprises a "magnetizing" inductance L$\phi$ in parallel with an equivalent resistance $R_2/S$. Where:

Rs (or $R_1$)=stator winding resistance
Ls=stator winding inductance
Lr=rotor winding inductance
Lm=mutual inductance
Rr=the rotor winding resistance
L$\sigma$=Ls−Lm$^2$/Lr=transient inductance
L$\phi$=Lm$^2$/Lr=magnetizing inductance
$\omega_E$=electrical frequency of the input current $I_1$
$\omega_R$=motor output rotational speed in radians per second referred to an electrical reference frame
S=Slip=$(\omega_E-\omega_R)/\omega_E$
$\omega_S$=slip frequency=$\omega_E-\omega_R$=$(1/\tau_R)(Iq/Id)$
where $\tau_R$=rotor time constant Iq=q-axis (or torque) current, and Id=d-axis (or magnetizing) current
$R_2=(Lm^2/Lr^2)*Rr$ Also, the rotor time constant $\tau_R$ and motor torque constant $K_T^*$ are related to the parameters of the circuit 90 as follows:

$$\tau_R = Lr/Rr = L\phi/R_2$$

$$K_T^* = (3/2)(P/2)L\phi Id = \text{torque/current}$$

where P=number of poles.

Figure 4:
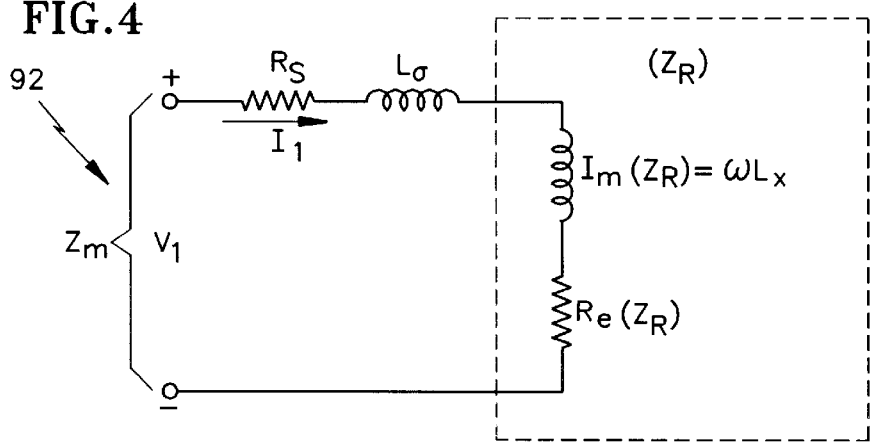
FIG. 4 is a simplified schematic diagram of the equivalent circuit of FIG. 3, in accordance with the present invention.

Referring to FIG. 4, the circuit 92 is an equivalent to the circuit 90 of FIG. 3 with the rotor impedance $Z_R$ transformed into an equivalent series circuit impedance having a real part Real($Z_R$) and an imaginary part Imag($Z_R$) equal to $\omega$Lx. The equivalent circuit 92 with the transformation of $Z_R$ is useful for determining the rotor time constant $\tau_R$ (discussed more hereinafter).

Figure 5:
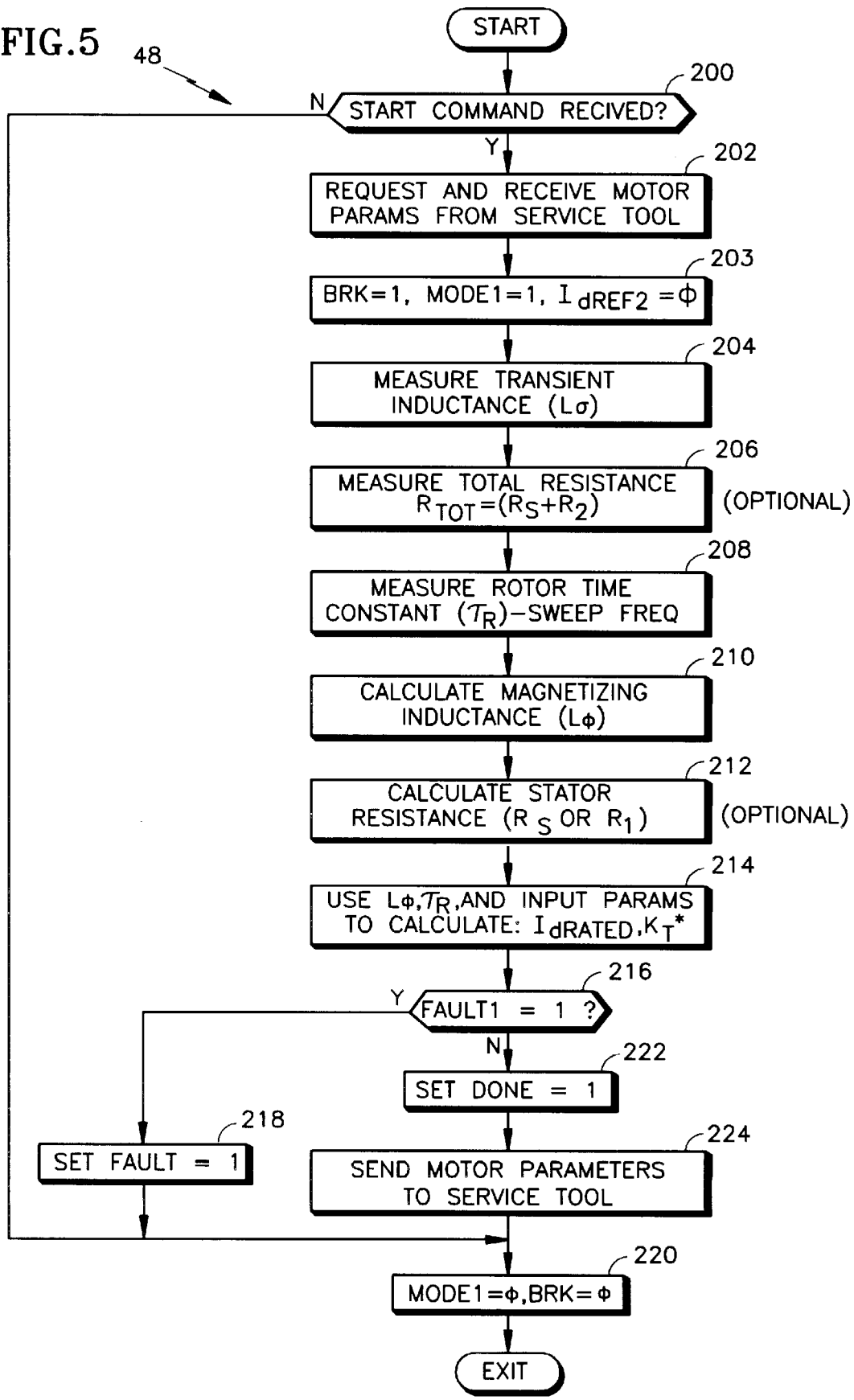
FIG. 5 is a logic flow diagram of the auto-calibration logic of FIG. 1, in accordance with the present invention.

Referring now to FIG. 5, a top level flow chart for the logic 48 begins at a step 200 which determines whether a start command has been received from the service tool 80. If it has not, the logic exits. If a start command has been received, a step 202 requests and receives motor parameters from the service tool 80 over the link 82 (FIG. 1), which are entered by service personnel. The motor parameters received are: the rated motor shaft power in watts (PWR_RATED); the rated motor speed in rpm (RPM_RATED); the rated rms line-to-line voltage in volts (VLL_RATED); the rated frequency in hertz (HZ_RATED); and number of poles (POLES), all of which may be obtained from the motor nameplate data.

Then, a step 203 sets MODE1=1, BRK=1 to cause the brake 37 (FIG. 1) to lock the rotor, and $I_{dREF2}$=0 amps. For each of the tests described herein, the rotor remains locked (rotor speed $\omega_R$=0) and $I_{dREF2}$=0 amps. When $\omega_R$=0 and $I_{dREF2}$=0, the slip S=1, and the motor current $I_1$ is equal to the q-axis current Iq and the motor voltage $V_1$ is equal to the q-axis voltage Vq. When Iq=0, the motor is operated in single phase operation, in accordance with the circuits of FIGS. 3, 4.

Next, a step 204 measures the transient inductance L$\sigma$, by providing a sinusoidal current signal into the q-axis of the reference current $I_{qREF2}$ on the line 17 (FIG. 1) at a frequency $F_{HIGH}$ high enough such that the motor impedance will be dominated by the transient inductance L$\sigma$, e.g., 31.25 Hertz. Other frequencies may be used if desired, e.g., greater than 30 Hz. The sinewave input signal is generated digitally by a signal processor, such as a digital signal processor, e.g., a Motorola DSP 56002 processor, with an update (or sample) rate of 5 KHz. Other hardware and/or software techniques or update rates may be used to generate the sinusoidal input signals.

The step 204 reads the q-axis feedback current Iq and the q-axis output voltage Vq (equal to the motor current $I_1$ and motor voltage $V_1$, respectively, as discussed hereinbefore). Next, the step 204 uses the aforementioned digital signal processor to perform a Discrete Fourier Transform (DFT) of Iq and Vq to determine the first harmonic Fourier coefficients. The fundamental or first harmonic component of a measured signal from a DFT is A sin($\omega$t)+B cos($\omega$t), where $\omega=2\pi f$ is the input frequency (in rad/sec). The first harmonic is used to calculate the impedance primarily so that non-linearities in the system do not distort the calculation.

To compute a DFT, as is known, standard sine and cosine waves of unit amplitude at the test frequency are generated within the logic 48. The measured signal (Iq,Vq) is multiplied by the standard sinewave and the product is integrated over one period of the excitation to yield the Fourier series coefficient A of the signal. Multiplying the signal by the standard cosine and integrating yields the B coefficient. We have found that integrating over 15 periods of the input signal it is sufficient to filter out any transients in the system response. Other numbers of periods may be used if desired. Also, for any DFT discussed herein, other types of Fourier transforms may be used if desired, e.g., a Fast Fourier Transform (FFT), etc., provided the first harmonic of the desired signal is obtained. Further, instead of a Fourier transform, any other filtering or spectrum analysis technique may be used for determining the first harmonic of the desired signals.

Then, the step 204 computes the motor impedance $Z_M$ by calculating the ratio of voltage to current ($V_1/I_1$=Vq/Iq) using the first harmonic components of voltage and current computed above. The step 204 then computes the real and imaginary parts of $Z_M$ from the Fourier coefficients. The imaginary part of the motor impedance $Z_M$ at $F_{HIGH}$ Hertz is dominated by the transient term $\omega L\sigma$. Thus, the transient inductance L$\sigma$ is the transient reactance (or imaginary part of $Z_M$) with the input frequency equal to $F_{HIGH}$ Hz, divided by the frequency $\omega$ in radians/sec ($2\pi F_{HIGH}$), or:

$$L\sigma = \text{Imag}(Z_M)@F_{HIGH} \text{ Hz}/(2\pi F_{HIGH})$$

Next, an optional step 206 measures the total resistance of the circuit impedance ($R_{TOT}=R_s+R_2$), i.e., the sum of the stator and rotor resistances, as the real part of the motor impedance $Z_M$ determined in step 204. Thus:

$$R_{TOT} = \text{Real}(Zm)@F_{HIGH}$$

In particular, at the relatively high frequency $F_{HIGH}$ used in step 204, the inductance L$\phi$ in the circuit 90 is large and the real part of $Z_M$ will be equal to $R_{TOT}$. The value of $R_{TOT}$ is saved for later use to calculate Rs (see step 212).

Next, a step 208 measures the rotor time constant $\tau_R$ as follows. The step 208 produces a progression of low frequency sinusoidal input q-axis reference currents $I_{qREF2}$ from 0.1 to 8.0 Hertz in increments defined by a search algorithm, discussed hereinafter. The sinewave input signal is generated digitally as discussed hereinbefore with step 204. At each frequency, the motor current Iq and voltage Vq (equal to the motor current $I_1$ and voltage $V_1$, respectively, as discussed hereinbefore) are measured and a DFT of the current $I_1$ and the motor voltage $V_1$ signals are computed separately. The fundamental or first harmonic Fourier coefficients are obtained as discussed hereinbefore with step 204.

Then, the step 208 computes the motor impedance $Z_M$ at each frequency by calculating the ratio of voltage to current ($V_1/I_1$). The step 208 then calculates the real and imaginary parts of the $Z_M$ from the Fourier coefficients. Then, the step 208 calculates the imaginary part of the rotor impedance Imag($Z_R$)=$\omega$Lx by subtracting the transient reactance ($\omega L\sigma$) from the imaginary part of the motor impedance $Z_M$, where L$\sigma$ was previously calculated in step 204 and $\omega$ is the input frequency, as follows:

$$\text{Imag}(Z_R)=\omega Lx=\text{Imag}(Z_M)-\omega L\sigma$$

Figure 6:
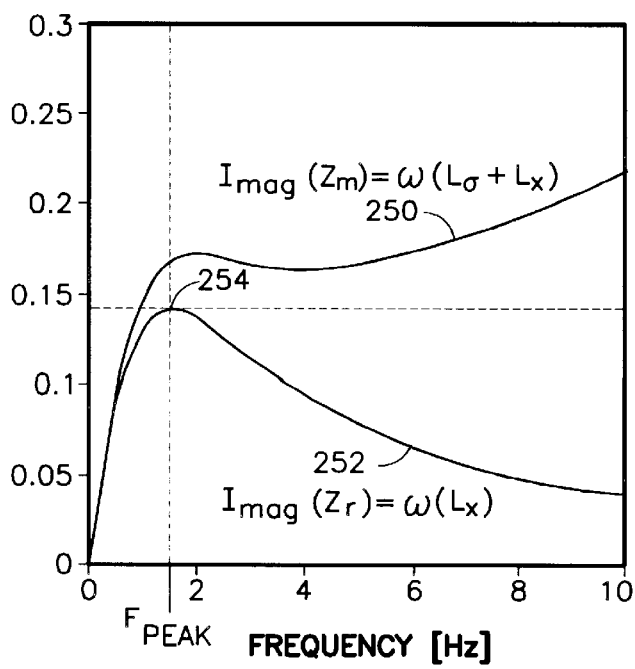
FIG. 6 is a graph of the imaginary part of the rotor impedance and of the motor impedance versus frequency, in accordance with the present invention.

Referring to FIG. 6, a curve 250 shows the imaginary part of the motor impedance Imag($Z_M$)=$\omega$(L$\sigma$+Lx) and a curve 252 shows the imaginary part of the rotor impedance Imag($Z_R$)=$\omega$Lx. The frequency $\omega$ (radians/second) at which the maximum 254 of the curve 252 occurs is the inverse of the rotor time constant, i.e., $\omega=1\tau_R$. A known search algorithm, e.g., a "golden section line search" algorithm, varies the input frequency and determines the frequency Fpeak at which the maximum value of $\omega$Lx occurs. The type of search algorithm used is not critical to the present invention, and any search algorithm that varies an input parameter and determines the maximum value of an output parameter may be used. The rotor time constant $\tau_R$ is then calculated as follows:

$$\tau_R=1/\omega\text{peak}=1/(2\pi\text{Fpeak})$$

Next a step 210 calculates the magnetizing inductance L$\phi$. In particular, at the frequency of rotor time constant ($\omega=1/\tau_R$) which is also the break frequency of the motor transfer function, the real and imaginary parts of the rotor impedance $Z_R$ are equal to each other, i.e., $\omega(L_x=R_x)$. Also, at this same frequency, it can be shown (below) that the $\omega L_x$ is also equal to ½$\omega$L$\phi$ (the magnetizing reactance). In particular, the rotor impedance $Z_R$ is equal to j$\omega$L$\phi$ in parallel with $R_2$, as shown below:

$$Z_R=j\omega L\phi R_2/(R_2+j\omega L\phi)$$

Multiplying the numerator and denominator by the complex conjugate of the denominator ($R_2-j\omega L\phi$), gives $$Z_R=\omega^2 L\phi^2 R_2/(R_2^2+\omega^2 L\phi^2)+j\omega L\phi R_2^2/(R_2^2+\omega^2 L\phi^2) \qquad \text{Eq. 1}$$

Which has the form of a series combination of impedances, or a real and imaginary part as indicated below:

$$Z_R=Rx+j\omega Lx$$

$$Z_R=\text{Real}+j \text{ Imaginary}$$

At the peak 254 of the curve 252 of Imag($Z_R$), the real and imaginary parts are equal, which gives:

$$\omega^2 L\phi^2 R_2/(R_2^2+\omega^2 L\phi^2)=\omega L\phi R_2^2/(R_2^2+\omega^2 L\phi^2) \qquad \text{Eq.2}$$

Simplifying Eq. 2, gives:

$$\omega L\phi=R_2$$

Substituting $R_2=\omega L\phi$ into the Imaginary part of $Z_R$, and setting equal to $\omega$Lx, gives:

$$\text{Imag}(Z_R)=(\omega L\phi)(\omega^2 L\phi^2)/(\omega^2 L\phi^2+\omega^2 L\phi^2)=\omega Lx \qquad \text{Eq. 3}$$

Simplifying Eq. 3, gives:

$$\omega Lx=\omega L\phi/2 \qquad \text{Eq. 4}$$

Thus, the magnetizing inductance L$\phi$ is calculated as follows:

$$L\phi = 2\text{Imag}(Z_R)/\omega @ \omega = 1/\tau_R$$

Next, an optional step 212 calculates the stator resistance $R_S$ by first calculating the value of $R_2$. It can be shown (below) that the real part of the rotor impedance Real($Z_R$) at $\omega = 1/\tau_R$ is equal to $R_2/2$. In particular, the real part of Eq. 1 is:

$$\text{Real}(Z_R) = Rx = L\phi^2 R_2/(R_2^2 + \omega^2 L\phi^2)$$

Substituting $R_2 = \omega L\phi$, and simplifying, gives:

$$Rx = R_2/2$$

Thus, $$R_2 = 2\text{Real}(Z_R) @ \omega = 1/\tau_R$$

Alternatively, $R_2$ may be calculated using the equation:

$$R_2 = L\phi/\tau_R$$

where $L\phi$ and $\tau_R$ were previously calculated in steps 204, 208, respectively. In either case, the stator resistance $R_S$ is then determined by subtracting $R_2$ from the total resistance ($R_{TOT} = R_S + R_2$) calculated in step 206. Thus, $$R_S = R_{TOT} - R_2$$

If the value for $R_S$ for the motor is already known, e.g., from the data sheet, it may be provided to the control over the link 82 and then $R_S$ may also be range checked in the step 212 to ensure it is within a predetermined percentage of the expected value. If $R_S$ is not within the desired range, the step 212 sets a fault flag FAULT=1. Alternatively, the value of $R_S$ may be calculated and provided to the service tool to help service personnel determine the type of motor installed in the system.

Figure 7:
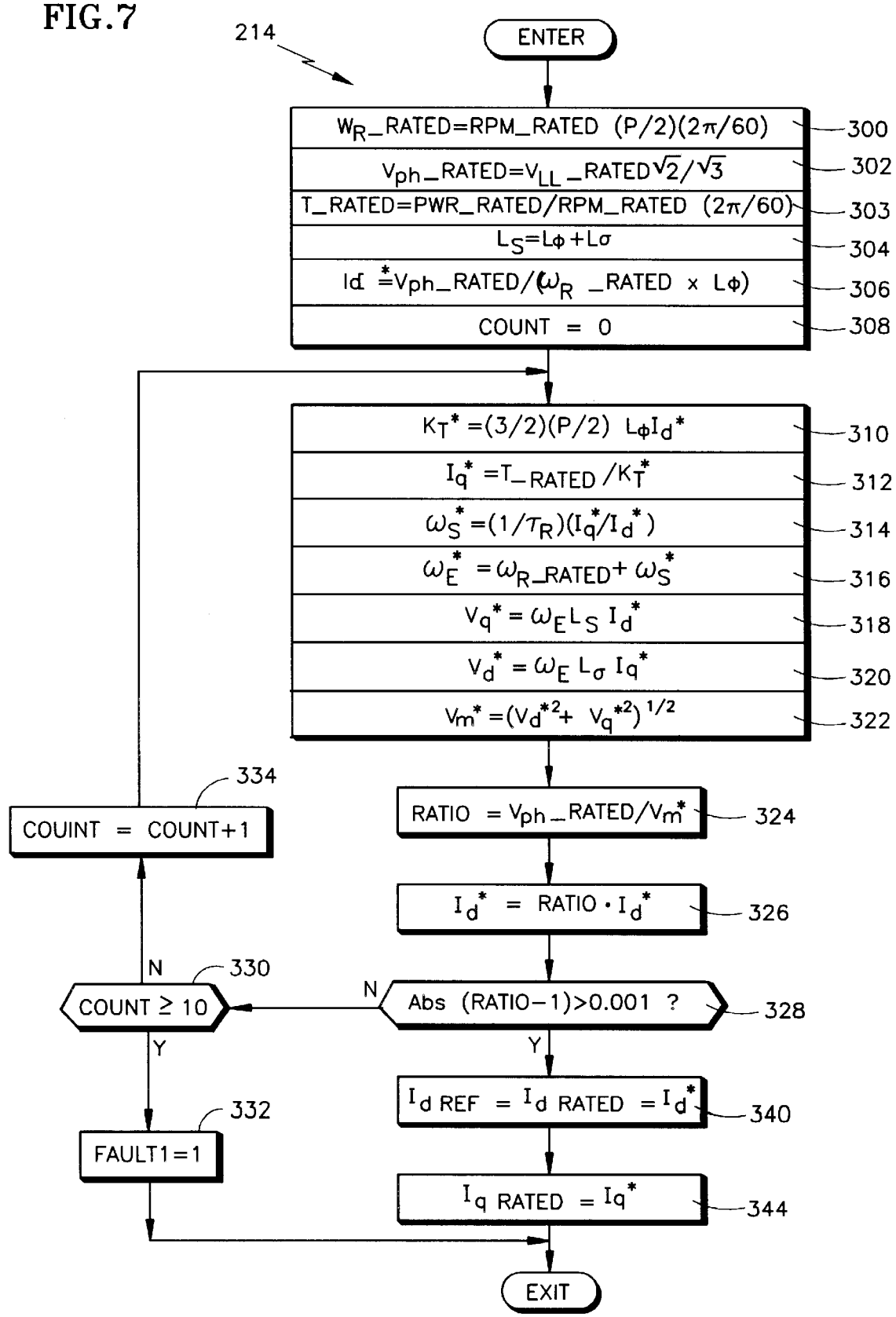
FIG. 7 is a logic flow diagram of a portion of the auto-calibration logic of FIG. 5, in accordance with the present invention.

Next, a step 214 uses $L\phi$, $\tau_R$, and the input parameters PWR_RATED, RPM_RATED, VLL_RATED, HZ_RATED, and POLES, obtained in the step 202, to simulate motor parameters and to iterate and calculate the rated magnetizing current $I_{dRATED}$, and the torque constant $K_T^*$, as shown in FIG. 7.

Referring to FIG. 7, the simulated motor parameters are indicated by an asterisk (*) to avoid confusion with actual measured motor parameters discussed hereinbefore. In particular, a step 300 calculates the rated rotational speed of the motor referred to the electrical reference frame $\omega_R\_$RATED. Next, a step 302 converts rated line-to-line voltage (VLL_RATED) to rated line-to-neutral voltage (or per-phase voltage) Vph_RATED. Next, a step 303 calculates the rated torque T_RATED based on rated power and rated RPM. Then, a step 304 calculates the stator inductance Ls as the sum of the transient inductance $L\sigma$ and the magnetizing $L\phi$. Next, a step 306 calculates an initial value for simulated d-axis current Id* based on a first order approximation of Id using rated voltage and speed. Next, a step 308 sets a variable COUNT equal to zero.

Next, a series of steps 310–322 calculates $K_T^*$ and a simulated motor voltage $V_M^*$ using various simulated motor parameters based on the value of $L\phi$ calculated in step 210 (FIG. 5), the parameters calculated in steps 300–308 above, and using known relationships for a field-oriented motor controller, some of which are discussed hereinbefore. In particular, a step 310 calculates the torque constant $K_T^*$ based on $L\phi$ calculated in step 210 (FIG. 5) and the current value of the magnetizing current Id*. Next, a step 312 calculates the torque current Iq*. Next, a step 314 calculates a simulated slip frequency $\omega_S^*$ which is used in a next step 316 to calculate a simulated electrical current frequency $\omega_E^*$ which is equal to the rotational frequency (or speed) of the motor (emulated as the rated speed) $\omega_R\_$RATED plus the slip frequency $\omega_S^*$. Next, a step 318 calculates a simulated q-axis output voltage Vq* based on the magnetizing current Id* and a step 320 calculates a simulated d-axis output voltage Vd* based on the torque current Iq*. Then, a step 322 calculates a simulated vector sum total motor voltage Vm* equal to the square root of the sum of the squares of the d-axis and q-axis output voltages Vd*, Vq*, respectively.

Next, a step 324 calculates a Ratio parameter equal to the ratio of the rated phase voltage Vph_RATED to the simulated per-phase motor voltage Vm*. The logic iterates until the Ratio goes to 1 within the desired tolerance, e.g., 0.001. When the ratio equals 1 the value of Id* will produce the rated voltage at the rated RPM and rated torque.

Next, a step 326 calculates a next value for Id* equal to the value of the Ratio times the current value of Id*. Next, a step 328 checks whether Ratio is within a predetermined tolerance of 1, e.g., 0.001. If it is not within the desired tolerance, a step 330 checks whether COUNT is greater than or equal to ten (i.e., whether the loop has iterated at least ten times). If the loop has iterated at least ten times, a FAULT flag is set equal to 1 at a step 332 and output to the service tool 80 over the link 82 (FIG. 1) and the logic is exited. If it has iterated less than ten times, a step 334 increments COUNT by one and the logic 214 goes the step 310 to iterate again.

If Ratio is within the desired tolerance in step 328, the logic is deemed to have converged and at convergence the values of Id* and Iq* are equal to the rated d-axis current $I_{dRATED}$ and the rated q-axis current $I_{qRATED}$, respectively. Accordingly, a step 340 sets the d-axis current reference $I_{dREF}$ equal to Id* which is equal to $I_{dRATED}$ and a step 344 sets $I_{qRATED}$ equal to Iq*. Then the logic 214 exits and returns to the logic 48 of FIG. 5.

Referring to FIG. 5, next, a step 216 determines whether an error has been detected in any of the above steps 202–214 (i.e., if FAULT1=1). If a fault has been detected, a step 218 sets FAULT=1 which is sent to the service tool 80 (FIG. 1) over the serial link 82 and a step 220 sets MODE1=0, BRK=0, and the logic exits. If a fault has not occurred, a step 222 sets the DONE flag equal to 1 which is transmitted via the serial link 82 to the service tool 80. Next, some or all of the motor parameters $\tau_R$, $K_T^*$, $I_{dRATED}$, $L\sigma$, $L\phi$, Rs, and $I_{qRATED}$ are transmitted via the serial link 82 to the service tool 80 in a step 224. The service tool 80 displays the parameters for use by the service personnel. Next, the step 220 sets MODE1=0, BRK=0, and the logic 48 exits.

Although the invention has been described and illustrated with respect to exemplary embodiments thereof, it should be understood by those skilled in the art that the foregoing, and various other changes, omissions and additions may be made without departing from the spirit and scope of the present invention.

What is claimed is:

1. A method for calculating at least one parameter of an elevator motor operated by field-oriented control, using standstill measurements of the motor, the motor having a motor impedance $Z_M$, a rotor impedance $Z_R$, and a transient inductance $L\sigma$, comprising the steps of:
   a) providing a sinusoidal torque current reference signal at a high frequency ($F_{HIGH}$) high enough such that the motor impedance ($Z_M$) is dominated by the transient inductance ($L\sigma$);
   b) measuring a feedback torque current (Iq) and a feedback torque voltage (Vq);

c) calculating said transient inductance (Lσ) at said high frequency ($F_{HIGH}$), by the equation:

$$L\sigma = \text{Imag}(Z_M)@F_{HIGH}/(2\pi F_{HIGH})$$

where $Z_M = Vq/Iq$;

d) providing a sinusoidal torque current reference signal having a variable input frequency;

e) measuring the feedback torque current (Iq) and the feedback torque voltage (Vq);

f) calculating an imaginary part of the rotor impedance Imag($Z_R$) as follows:

$$\text{Imag}(Z_R) = \text{Imag}(Z_M) - \omega L\sigma$$

where ω is said input frequency, and $Z_M = Vq/Iq$;

g) varying said input frequency and performing steps (d)–(f) to obtain the frequency ($F_{PEAK}$) at which the maximum value of Imag($Z_R$) occurs; and h) calculating a rotor time constant ($\tau_R$) based on $F_{PEAK}$.

2. The method of claim 1, wherein said $\tau_R$ is calculated as follows:

$$\tau_R = 1/(2\pi F_{PEAK}).$$

3. The method of claim 1, wherein said step of calculating Zm comprises computing a first harmonic of Vq and a first harmonic of Iq.

4. The method of claim 3, wherein said step of computing the first harmonic of Iq and Vq, comprises computing Fourier transforms of Iq and of Vq.

5. The method of claim 2, further comprising a step of calculating a magnetizing inductance Lφ as follows:

$$L\phi = 2\text{Imag}(Z_R)/\omega @\omega = 1/\tau_R.$$

6. The method of claim 5, further comprising the steps of:

i) calculating a motor torque constant ($K_T^*$) using the equation:

$$K_T^* = (3/2)(P/2)L\phi Id^*$$

where:

P = number of motor poles;

$$Id^* = Vph\_RATED/(\omega R\_RATED \times L\phi);$$

and

Vph_RATED = rated motor voltage;

ωR_RATED = rated motor speed;

j) calculating a motor voltage (Vm*) using the equation:

$$Vm^* = (Vd^{*2} + Vq^{*2})^{1/2}$$

where:

$Vd^* = \omega L\sigma Iq^*$;

$Vq^* = \omega_E Ls Id^*$;

$Iq^* = T\_RATED/K_T^*$;

T_RATED is the rated motor torque;

$\omega_E = \omega_{R\_RATED} + \omega_S^*$; and $\omega_S^* = (1/\tau_R)(Iq^*/Id^*)$;

k) calculating a ratio of Vph_RATED to Vm*; and l) varying Id* and performing steps (h)–(k) until said ratio is within a predetermined tolerance of 1.

7. The method of claim 6, wherein said step of varying Id* comprises calculating the next value of Id* as Id*×Ratio.

8. The method of claim 5, further comprising the steps of:

m) calculating a total resistance (RTOT) at said high frequency, by the equation:

$$R_{TOT} = \text{Real}(Zm)@F_{HIGH}$$

n) calculating a stator resistance (Rs) as follows:

$$R_S = R_{TOT} - R_2$$

where $R_2 = L\phi/\tau_R$; and o) performing step (m) between the steps (b) and (d).

9. The method of claim 1, wherein said steps (a)–(h) are performed automatically upon receiving a command from a service tool.

10. The method of claim 6, wherein said steps (a)–(l) are performed automatically upon receiving a command from a service tool.

* * * * *